(12) United States Patent
Okagawa et al.

(10) Patent No.: US 7,179,667 B2
(45) Date of Patent: *Feb. 20, 2007

(54) SEMICONDUCTOR BASE MATERIAL AND METHOD OF MANUFACTURING THE MATERIAL

(75) Inventors: Hiroaki Okagawa, Itami (JP); Kazuyuki Tadatomo, Itami (JP); Yoichiro Ouchi, Itami (JP); Takashi Tsunekawa, Itami (JP)

(73) Assignee: Mitsubishi Cable Industries, Ltd., Amagasaki (JP)

( * ) Notice: Subject to any disclaimer, the term of this patent is extended or adjusted under 35 U.S.C. 154(b) by 441 days.

This patent is subject to a terminal disclaimer.

(21) Appl. No.: 10/380,933

(22) PCT Filed: Sep. 17, 2001

(86) PCT No.: PCT/JP01/08035

§ 371 (c)(1),
(2), (4) Date: Apr. 17, 2003

(87) PCT Pub. No.: WO02/23604

PCT Pub. Date: Mar. 21, 2002

(65) Prior Publication Data

US 2004/0048471 A1      Mar. 11, 2004

(30) Foreign Application Priority Data

Sep. 18, 2000  (JP) .............................. 2000-282047
Mar. 12, 2001  (JP) .............................. 2001-068067

(51) Int. Cl.
*H01L 21/00* (2006.01)
*C30B 23/00* (2006.01)

(52) U.S. Cl. .............................. 438/22; 438/29; 438/42; 117/86; 257/98; 257/103

(58) Field of Classification Search .................. 117/86; 438/22, 29, 42; 257/98, 103
See application file for complete search history.

(56) References Cited

U.S. PATENT DOCUMENTS 4,758,529 A * 7/1988 Ipri .............................. 438/165

(Continued)

FOREIGN PATENT DOCUMENTS

EP            0 993 048 A2      4/2000

(Continued)

*Primary Examiner*—Yogendra Gupta
*Assistant Examiner*—G. Nagesh Rao
(74) *Attorney, Agent, or Firm*—Leydig, Voit & Mayer, Ltd.

(57) ABSTRACT

As shown in FIG. 1(a), substrate 1 having a growth plane having a concavo-convex surface is used. When GaN group crystal is vapor phase grown using this substrate, the concavo-convex shape suppresses growth in the lateral direction and promotes growth in the C axis direction, thereby affording a base surface capable of forming a facet plane. Thus, as shown in FIG. 1(b), a crystal having a facet plane is grown in a convex part, and a crystal is also grown in a concave part. When the crystal growth is continued, the films grown from the convex part and the concave part are joined in time to cover a concavo-convex surface and become flat as shown in FIG. 1(c). In this case, an area having a low a dislocation density is formed in the upper part of the convex part where facet plane was formed, and the prepared film has high quality.

9 Claims, 5 Drawing Sheets

U.S. PATENT DOCUMENTS

| | | | |
|---|---|---|---|
| 5,173,751 A * | 12/1992 | Ota et al. | 257/76 |
| 5,290,393 A * | 3/1994 | Nakamura | 438/509 |
| 5,739,554 A * | 4/1998 | Edmond et al. | 257/103 |
| 5,787,104 A * | 7/1998 | Kamiyama et al. | 372/43.01 |
| 5,966,620 A * | 10/1999 | Sakaguchi et al. | 438/455 |
| 6,163,038 A * | 12/2000 | Chen et al. | 257/103 |
| 6,306,212 B1 * | 10/2001 | Santiago et al. | 117/92 |
| 6,316,785 B1 | 11/2001 | Nunoue et al. | |
| 6,331,063 B1 * | 12/2001 | Kamada et al. | 362/237 |
| 6,350,703 B1 * | 2/2002 | Sakaguchi et al. | 438/766 |
| 6,441,403 B1 * | 8/2002 | Chang et al. | 257/94 |
| 6,534,382 B1 * | 3/2003 | Sakaguchi et al. | 438/455 |
| 6,827,870 B1 * | 12/2004 | Gianchandani et al. | 216/71 |
| 6,940,098 B1 * | 9/2005 | Tadatomo et al. | 257/87 |
| 6,967,122 B2 * | 11/2005 | Tezen | 438/93 |
| 7,053,420 B2 | 5/2006 | Tadatomo et al. | |
| 2001/0050376 A1 * | 12/2001 | Shibata et al. | 257/190 |

FOREIGN PATENT DOCUMENTS

| | | |
|---|---|---|
| EP | 1 005 068 A2 | 5/2000 |
| EP | 1 101 841 A2 | 5/2001 |
| EP | 1 184 897 A1 | 3/2002 |
| EP | 1 280 190 A1 | 1/2003 |
| JP | 5-267175 A | 10/1993 |
| JP | 11-251631 A | 9/1999 |
| JP | 2000-91253 A | 3/2000 |
| JP | 2000-106455 A | 4/2000 |
| JP | 2000-124500 A | 4/2000 |
| JP | 2000-244061 A | 9/2000 |
| JP | 2001-057341 A | 2/2001 |
| JP | 2001-093837 A | 4/2001 |

* cited by examiner

SEMICONDUCTOR BASE MATERIAL AND METHOD OF MANUFACTURING THE MATERIAL

TECHNICAL FIELD

The present invention relates to a semiconductor base and a production method thereof. More particularly, this invention relates to a structure useful when using a semiconductor material associated with easy occurrence of dislocation defects and a method thereof.

BACKGROUND ART

For crystal growth of a GaN group material, a substrate that does not lattice match therewith, such as sapphire, SiC, Spinel, and recently Si and the like, has been used due to the absence of a substrate that lattice matches with GaN group materials. However, a GaN film produced contains dislocations of as many as $10^{10}$ points/cm$^2$ due to the absence of lattice match. While high luminance Light Emitting Diodes, semiconductor lasers and the like have been realized in recent years, reduction of dislocation density has been desired for improved properties.

As a method for reducing the dislocation density when, for example, a GaN group semiconductor substrate and the like are grown on a buffer layer and a GaN substrate by vapor phase growth, a method comprising formation of a partial mask on the aforementioned substrate and selective growth to achieve crystal growth in the lateral direction has been proposed, thereby to give a high quality crystal having a reduced dislocation density (e.g., JP-A-10-312971).

It has been clarified that, according to the above-mentioned method, a problem occurs that, in the part of a mask layer where growth in the lateral direction occurred, the C axis tilts in a slight amount toward the direction of the lateral growth, which in turn causes a new problem of degraded crystal quality (Abstracts G3.1 of MRS 1998 Fall Meeting). This can be confirmed through measurement ($\phi$ scan) of the incident orientation dependency in X-ray rocking curve measurement (XRC). That is, a full width at half-maximum (FWHM) of X-ray rocking curve by incident X-ray from the direction of lateral growth is greater than the FWHM value by X-ray from a stripe direction of a mask layer, which means the presence of orientation dependency in the micro tilting of the C axis. This suggests a possibility of inducing a number of new defects in the junction part of the lateral growth on the mask.

As the mask layer material, $SiO_2$ is generally used. However, a problem has been found that, when a crystal growth layer is laminated thereon, the Si component transfers into the crystal growth layer, constituting a problem of autodoping contamination.

When a semiconductor material containing Al, such as AlGaN, is grown on a substrate having an $SiO_2$ mask layer, crystal growth occurs on the mask layer, too, preventing effective selective growth itself.

In an attempt to solve such problems, a method has been proposed wherein a stripe groove processing is applied to a substrate having a buffer layer and a GaN layer formed on an SiC base substrate, which groove reaching the SiC layer to form a convex, and crystal growth is started from the GaN layer on the top of this convex (Abstracts G3.38 of MRS 1998 Fall Meeting). According to this method, a selective growth without an $SiO_2$ mask layer is possible, whereby resolving various problems caused by the use of the aforementioned $SiO_2$ mask.

For the above-mentioned method, a sapphire substrate can be used as the base substrate and the method thereof is also disclosed (e.g., JP-A-11-191659). The above-mentioned method requires steps of crystal growing a buffer layer material and a GaN group material on a sapphire base substrate, taking the substrate out from a growth furnace to apply a groove processing, and then crystal growing again, thus posing a new inconvenience of complicated production process, increased number of steps, higher cost and the like.

In addition, a method for suppressing propagation of dislocation by forming concavo-convex grooves on a substrate and growing a gallium nitride group semiconductor while forming a cavity in the concave part has been disclosed (JP-A-2000-106455). According to this method, a low dislocation density area can be formed by a single growth, but a cavity needs to be formed. Thus, when a light emitting element and the like are prepared, it is inconvenient when releasing the heat generated in the light emitting part to the substrate side, thus problematically encouraging thermal degradation of laser diode and the like. Moreover, since this method does not actively control propagation of dislocation, the dislocation propagates to the upper part of the convex part, problematically making reduction of dislocation density insufficient.

DISCLOSURE OF THE INVENTION

In view of the above-mentioned problems, it is therefore an object of the present invention to avoid various problems caused by the use of a mask layer, and to simplify the production step. The invention additionally aims at resolving the problem of unattainable selective growth of AlGaN, which has been conventionally difficult. Moreover, the invention aims at avoiding the issue of heat caused by the formation of cavity parts.

The semiconductor base of the present invention consists of a substrate and a semiconductor crystal formed on the substrate by vapor phase growth, wherein the crystal growth plane of the aforementioned substrate is a concavo-convex surface and the aforementioned semiconductor crystal is grown from the concave part and/or the convex part while forming a facet structure.

In addition, when the above-mentioned semiconductor crystal is InGaAlN, a particular effect can be obtained.

It is preferable to make the convex part of the crystal growth plane of the above-mentioned substrate a convex part having a parallel stripe pattern. It is more preferable that the above-mentioned semiconductor crystal be InGaAlN and the longitudinal direction of the stripe be parallel to the (1-100) plane or the (11-20) plane of the InGaAlN crystal.

In a stripe structure obtained by subjecting the above-mentioned substrate to concavo-convex processing, it is desirable that the longitudinal direction of the stripe be parallel with the (1-100) plane or the (11-20) plane of the above-mentioned InGaAlN crystal and the precision thereof be not more than 1°. In a preferable stripe structure, the total (A+B) of width A of the convex part and width B of the adjacent concave part is not more than 20 μm, and a depth H of the aforementioned concave part is not less than 20% of the greater width of A or B.

It is also desirable to make an angle formed by the rising slope of a convex part formed by concavo-convex processing of the above-mentioned substrate, and a substrate plane to be not smaller than 60°. It is also possible to equip a curved part on the bottom of the concave part.

In the above-mentioned semiconductor base, the crystal growth plane of the aforementioned substrate may be a concavo-convex surface, wherein the concave plane of the concavo-convex surface is processed such that crystal growth does not occur substantially from the surface thereof, and a semiconductor crystal may be grown from the convex part while forming a facet structure.

BRIEF DESCRIPTION OF THE DRAWING

In each of the Figures, 1 is a substrate, 11 is a convex part, 12 is a concave part, 13 is a cavity part and 2 is a semiconductor layer.

DETAILED DESCRIPTION OF THE INVENTION

The present invention is characterized in that a concavo-convex surface is formed on a-substrate before formation of even a buffer layer and the like, thereby to provide a base surface, on which a facet plane can be formed, from the start of crystal growth. That is, by equipping a concavo-convex surface on the substrate, each or both of the concave plane and the convex plane separated by steps is/are prepared as unit standard surface on which to grow a facet structure in vapor phase growth. When both the concave plane and the convex plane are prepared as planes capable of facet structure growth, the crystal growth occurs in the entirety of the substrate surface in the initial stage of the growth, thus resulting in the growth comprising a facet plane on both the convex part and the concave part. In contrast, when either the concave plane or the convex plane is substantially incapable of crystal growth because it has an extremely small width and the like, or the crystal growth itself is possible but the surface thereof is processed and substantially incapable of crystal growth, the facet structure growth occurs from either the convex part or the concave part. In some cases, the facet structure growth occurs from either the convex part or concave part but non-facet structure growth occurs from the other plane.

As a result, the dislocation line extending from the substrate in the C axis direction is bent toward the lateral direction in the facet plane and fails to propagate upward. Subsequent continuous growth makes the growth plane flat in time and the vicinity of the surface thereof becomes a low dislocation density area due to the absence of propagation of dislocation from the substrate. In other words, the formation of a low dislocation density area is achieved without using a mask layer as in conventional cases and without necessitating a grounding layer. Particularly, the problem of heat dissipation can be avoided due to the absence of the need to form a cavity part.

The embodiment of the present invention is explained in detail in the following based on drawings.

Figure 1:
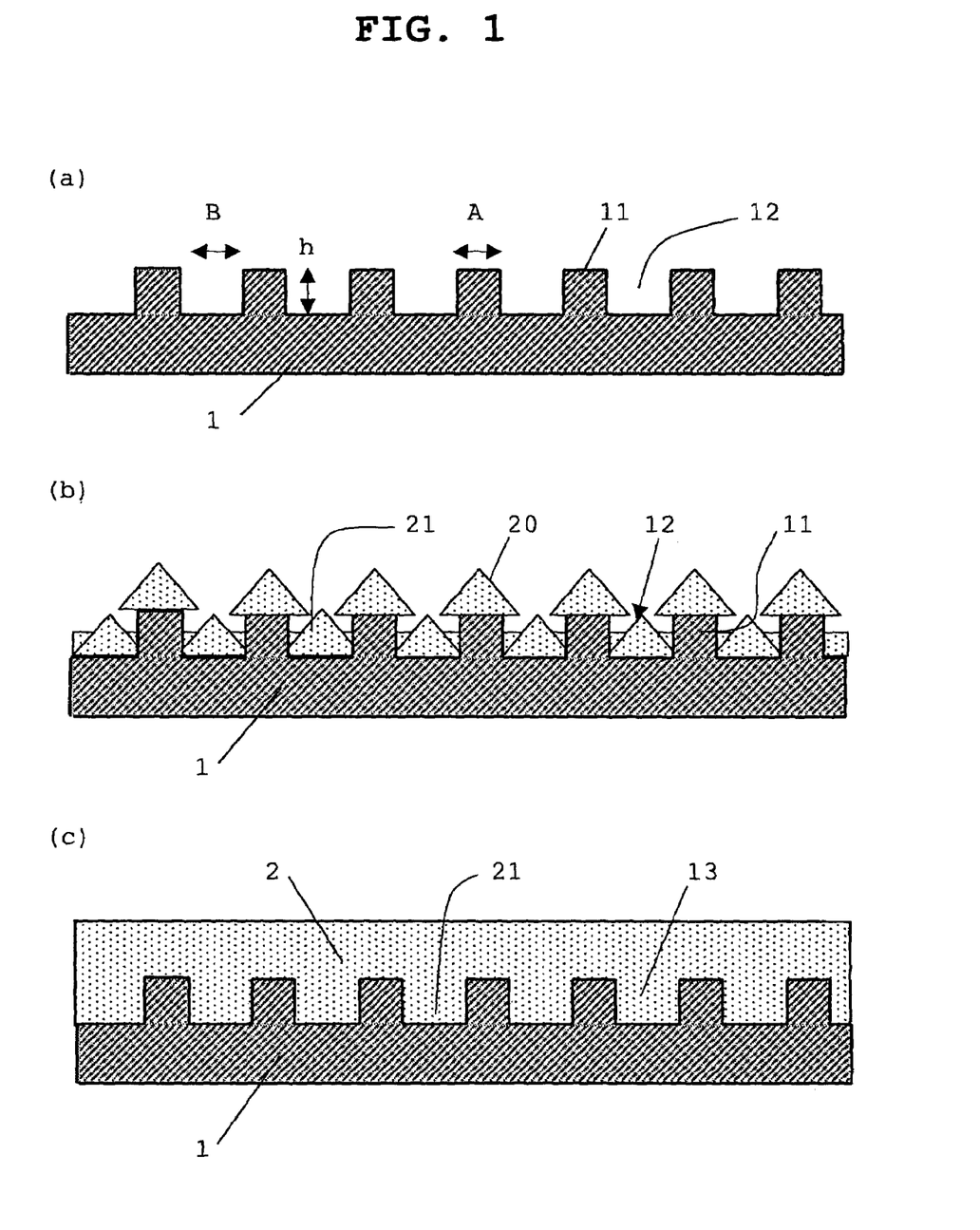
FIG. 1 is a cross section for explanation of the state of crystal growth of the semiconductor base of the present invention.

FIGS. 1(a) to 1(c) show cross sectional views to explain the state of crystal growth of the semiconductor base of the present invention. In these Figures, 1 is a substrate and 2 is a semiconductor crystal grown by vapor phase growth on the substrate 1. On the crystal growth plane of the substrate 1 are formed a convex part 11 and a concave part 12, which are the base surfaces on which to form a facet plane from the aforementioned convex part 11 and/or concave part 12.

The above-mentioned substrate 1 is a base substrate on which to grow various semiconductor crystal layers, in the state before the formation of a buffer layer and the like for lattice matching. As such substrate, sapphire (C-plane, A-plane, R-plane), SiC (6H, 4H, 3C), GaN, AlN, Si, Spinel, ZnO, GaAs, NGO and the like can be used, but other materials may be used as long as the object of the invention is achieved. The plane direction of the substrate is not particularly limited and may be a just substrate or one having an off angle. In addition, a sapphire substrate and the like having several μM of GaN group semiconductor epitaxially grown thereon may be used.

As the semiconductor layer to be grown on the substrate 1, various semiconductor materials can be used. Examples thereof include $Al_xGa_{1-x-y}In_yN$ ($0 \leq x \leq 1$, $0 \leq y \leq 1$, $0 \leq x+y \leq 1$) wherein the composition ratios of x and y are varied, such as GaN, $Al_{0.2}Ga_{0.8}N$, $In_{0.4}Ga_{0.6}N$ and the like.

In the case of a semiconductor material containing Al, such as AlGaN and the like, the conventional mask method poses a problem of growth on an $SiO_2$ mask layer. Because the present invention resolves this problem by eliminating masking, conventionally unattainable AlGaN low dislocation density can be now achieved, whereby a low dislocation, high quality film growth is afforded from right above the substrate. As a result, light absorption by GaN layer, a problem in ultraviolet light emitting element and the like, is obliterated, which is particularly preferable from a practical aspect.

The following explains a base surface capable of forming a facet plane, wherein concavo-convex shaped parts 11 and 12 are formed on a crystal growth plane of substrate 1.

For typical growth of GaN, a high temperature GaN film is grown on a sapphire C-plane substrate via a low temperature buffer layer by conventional MOVPE method and the like. When a high temperature GaN is grown on a low temperature buffer layer, the buffer layer becomes a core, which core joins along with the growth in the lateral direction and becomes flat. At this point, because the sapphire substrate is free of processing, the growth proceeds to form a stable C-plane and GaN becomes flat. This is attributable to the fact that the growth rate in the lateral direction is faster than that of the stable C-plane.

On the other hand, when the rate of growth in the lateral direction is suppressed and the rate of growth in the C axis direction is increased, an inclined facet {1-101} and the like can be formed. In the present invention, the growth plane of the substrate is subjected to a concavo-convex processing to suppress the above-mentioned growth in the lateral direction.

In the present invention, the shape of the concavo-convex is subject to no particular limitation as long as the above-mentioned effect can be achieved, and various shapes can be employed.

For forming such a concavo-convex surface, island type intersperse convex parts, stripe type convex parts consisting of convex lines, lattice convex parts, convex parts wherein the lines forming these are curves and the like, can be employed.

Of these modes of the convex part, one comprising a stripe convex line is preferable, because the production steps thereof can be simplified and regular patterns can be easily formed. While the longitudinal direction of the stripe may be any, when the material to be grown on the substrate is GaN and said direction is the <11-20> direction of the GaN group material, the growth in the lateral direction can be suppressed and oblique {1-101} facets and the like are easily formed. As a result, the dislocation propagated in the C axis direction from the substrate side is bent in this facet plane to the lateral direction and resists upward propagation, which in turn particularly preferably forms a low dislocation density area.

Even when the stripe direction is set for the <1-100> direction, similar effects as mentioned above can be obtained by determining the growth conditions permitting easy formation of facet plane.

The direction of the stripe formed by concavo-convex processing of the above-mentioned substrate is most preferably the <1-100> direction or the <11-20> direction of the InGaAlN crystal. However, because it accompanies a growth phenomenon where adjacent facets are joined and leveled, the direction may not match strictly the aforementioned direction. While the presence of a little direction error is tolerable, it is desirable to make the precision of the stripe direction of not more than 1°, particularly preferably within 0.2°, relative to the <1-100> direction or the <11-20> direction of InGaAlN crystal.

In FIG. 1, as shown in (a), substrate 1 wherein width B of a concave part 11 and width A of the convex part 12 are the same, is used. In this case, the growth proceeds while forming facet planes in both the convex part 11 and the concave part 12, thereby forming crystal units 20 and 21. Because, in concave part 12, the growth occurs in the valley between the sidewall and the facet plane, as shown in FIG. 1(b), a buried valley is included. When the crystal growth continues in this situation, the crystal unit 21 on the convex part 11 and the crystal unit 21 on the concave part grow, films are joined and the concavo-convex surface of substrate 1 is covered as shown in FIG. 1(c). In this case, a low dislocation area is formed on the upper part where a facet plane was once formed, and the produced film comes to have high quality.

Figure 2:
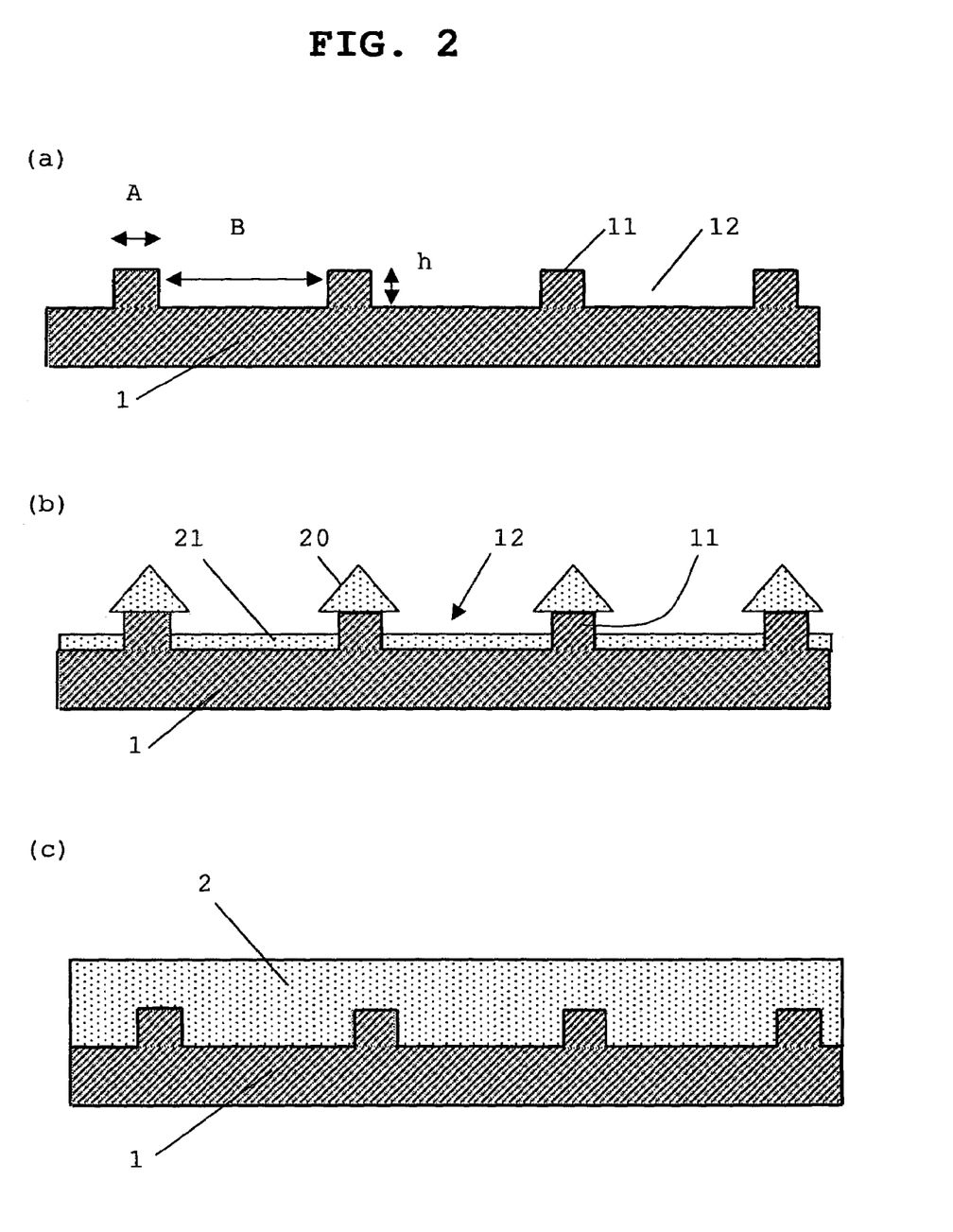
FIG. 2 is a cross section for explanation of the state of crystal growth of the semiconductor base of the present invention.

In the embodiment of FIG. 2, as shown in (a), a substrate 1 wherein width A of convex part 11 is narrower than width B of concave part is used. In this case, the growth proceeds in the convex part 11 forming a facet plane, and crystal growth occurs in the concave part 12 as well (FIG. 2(b)). In this situation, when the crystal growth continues, the films grown from the convex part 11 and the concave part 12 are joined to cover the concavo-convex surface, as shown in FIG. 2(c). In this case, while a low dislocation area is formed on the upper part 11 where a facet plane was once formed, but a facet plane is difficult to form from the shape of the concave part 11, and the effect of bending the dislocation to the lateral direction reduces. Thus, as compared to the embodiment of FIG. 1, while the effect of reduction of dislocation density is small, the produced film comes to have high quality.

Figure 4:
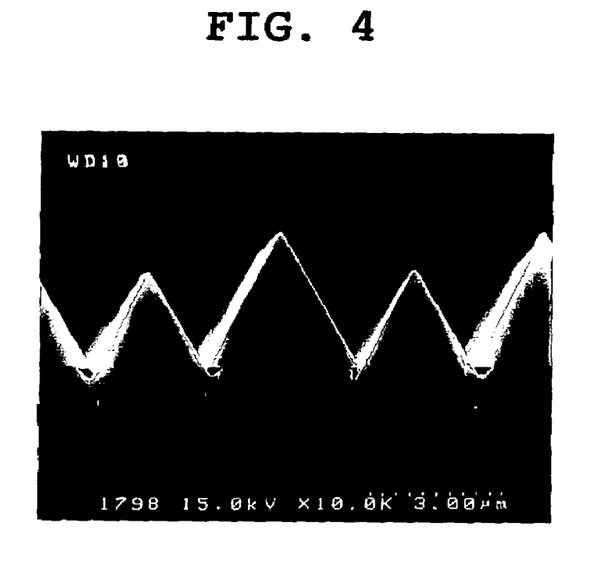
FIG. 4 is a cross sectional photograph showing complete formation of facets.
Figure 5:
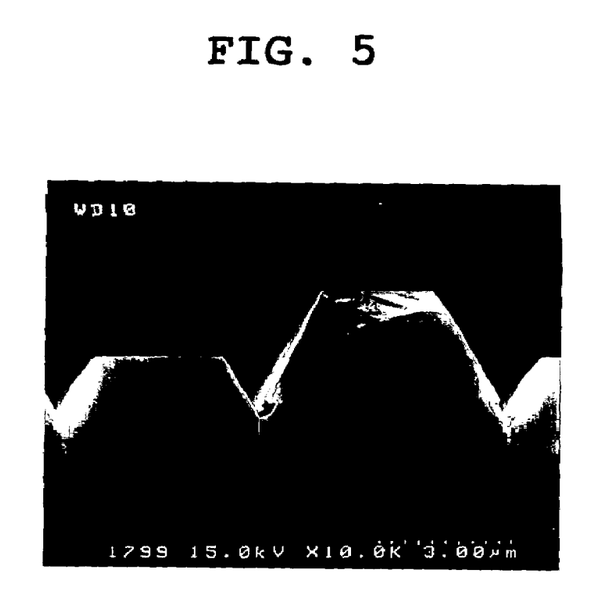
FIG. 5 is a cross sectional photograph showing incomplete formation of facets.
Figure 6:
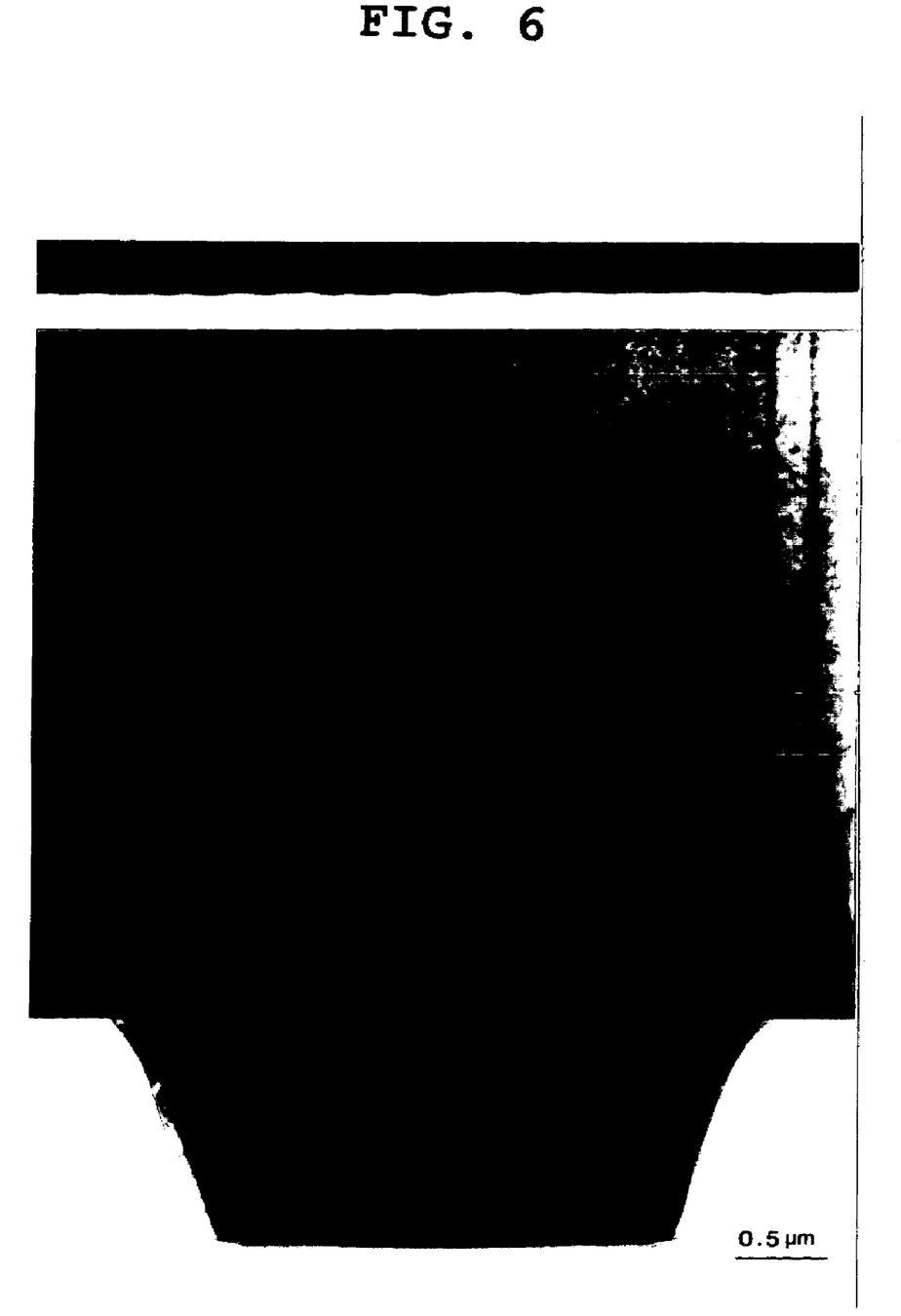
FIG. 6 is a cross sectional photograph showing bending of the dislocation line (black line in the photograph) along with the growth of the facet.

While the area where a facet plane is formed varies greatly by the combination of width B of the concave part and width A of the convex part, propagation of dislocation can be bent by the formation of facet planes, whereby low dislocation density can be achieved. Accordingly, while this facet plane may be any as long as the propagation of dislocation is bent, in a preferable embodiment as shown in FIG. 1, crystal unit 20 grown from one facet structure growth base plane does not have a flat part on its top plane but has an angle shape where both facet planes completely cross at the top part (FIG. 4 shows complete formation of facet and FIG. 5 shows cross sectional photograph showing an incomplete case). Such facet plane shown in FIG. 1 (FIG. 4) is preferable because it can bend almost all the dislocation lines succeeded from the aforementioned base plane and can further reduce the dislocation density right above. FIG. 6 is a cross sectional photograph showing such state, wherein it is clearly observed that the dislocation line (black line in the photograph) is bent along the facet growth.

The area where the facet plane is formed can be controlled by not only the combination of width but by changing the depth h of the concave part (height of convex part).

As mentioned above, the combination of concavo-convex includes various ones. In view of the application to a light emitting element, the width of concave part 12 and convex part 11, and the depth h of the concave part are preferably such that the total (A+B) of width A of the convex part and width B of the adjacent concave part is not more than 20 μm, and the depth h of the aforementioned concave part is not less than 20% of the greater width of A or B.

When the facet plane to be formed is {1-101} facet, the angle of the facet plane thereof with the substrate plane is about 60°. Therefore, the height necessary for complete formation of the facet in this case is $\sqrt{3}/2$ (i.e., (square root of 3)/2) relative to the width of the bottom surface. When the bottom surface is considered to correspond to width B of concave part or width A of convex part, forming the facets, A should have the height of B×$\sqrt{3}/2$. When A or B exceeds 20 μm, the necessary height is about 17 μm, frequently posing the problems of occurrence of warp due to a thick substrate, long time for growth and the like. As a result of the studies of the present inventors, when A+B≦20 μm, occurrence of warp could be reduced and the growth did not require a long time.

The depth h of the concave part has been also considered in the same manner as above, and it has been confirmed that when it is set for not less than 20% of the longer of A or B, the facets are formed and reduction of dislocation can be promoted.

The angle formed by the rising slope of a convex part 11 formed by concavo-convex processing of the substrate, and a substrate plane is preferably not smaller than 60°, particularly desirably as near as possible to a right angle. When it is smaller than 60°, the growth begins from the slope of the convex part and a problem of difficult flattening after facet growth occurred. As a result of the studies of the present inventors, it has been found that an angle of not less than 60°, among others a rising slope near a right angle, permits formation of facets and flattening thereafter is not substantially inhibited. If possible, a slope angle exceeding 90° is also preferable.

It is also possible to provide a curve on the bottom surface of concave part 12 concavo-convex processed on the substrate. Typically, a curve having a gentle concave surface when seen at a cross section between the rising base of one convex part 11 and the rising base of the adjacent convex part 11. When such curve is provided, the growth can be controlled such that the growth from the concave part 12 becomes slow and the growth from the convex part 11 is dominant.

Figure 3:
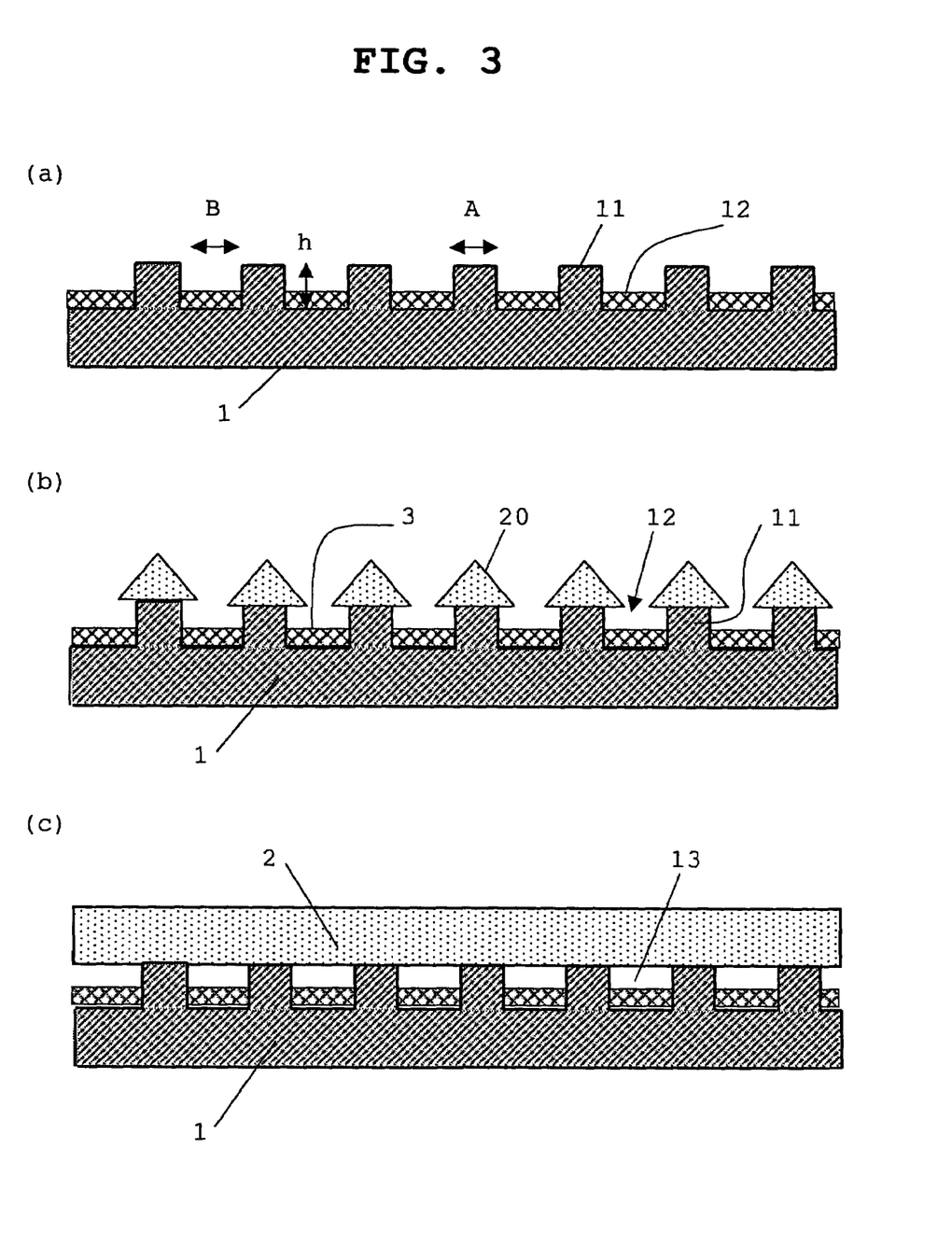
FIG. 3 is a cross section for explanation of the state of crystal growth of the semiconductor base of the present invention.

FIG. 3 shows another embodiment of the present invention. The formation of concavo-convex and the like are as shown in FIG. 1, but as shown in FIG. 3(a), in this embodiment, a mask layer 3 is formed on the concave part 12 of the substrate 1, which prevents substantial crystal grow from the surface. In this case, the growth while forming a facet plane occurs only from the convex part 11, crystal unit 20 is formed (FIG. 3(b)), and when the crystal growth is continued, crystal units 20 grown from each convex part 11 are joined to cover the concavo-convex surface as shown in FIG. 3(c). In this embodiment, too, when the facet plane is formed, the propagation of dislocation can be bent, thereby low dislocation density can be achieved.

In the above-mentioned embodiment, as the mask layer 3, an $SiO_2$ mask and the like can be used. The processing is free of any particular limitation as long as it prevents substantial crystal growth, such as formation of a thin film and the like. In addition, by making either the concave part or the convex part a concave part having a minute opening or a convex part having a minute width that cannot cause substantial crystal growth, the growth of the facet structure can be made to occur from only one of them.

In the above, an embodiment where only a single layer of the semiconductor layer 2 is grown on the substrate 1 has been explained. To further reduce dislocation defects, a similar step may be repeated. Furthermore, similar steps may be repeated to form plural semiconductor layers in multiplicity. This constitution can gradually reduce the dislocation which is propagated as the layers are laminated.

A convex part can be formed by a conventional photolithography technique, which comprises patterning according to the shape of the convex part and applying etching processing by RIE technique and the like.

As a method for crystal growth of a semiconductor layer on a substrate, HVPE, MOVPE, MBE and the like may be performed. When a thick film is to be prepared, the HVPE method is preferable, but when a thin film is to be prepared, MOVPE method and MBE method are preferable.

Formation of the facet plane can be controlled by the growth conditions (kind of gas, growth pressure, growth temperature and the like) for crystal growth. In the case of decompression growth, lower $NH_3$ partial pressure leads to easy formation of facets in the <1-101> plane and growth at normal pressure leads to easy formation of facet planes as compared to reduced pressure.

When the growth temperature is raised, the growth in the lateral direction is promoted, and the growth at a low temperature causes more rapid growth in the C axis direction than growth in the lateral direction, thereby making facet plane easy to form.

The foregoing shows that the shape of facet can be controlled by growth conditions. As long as the effect of the present invention is afforded, other conditions can be employed according to the object.

When the facet plane is formed and the dislocation is bent in the lateral direction, the growth conditions are preferably changed to promote growth in the lateral direction to flatten GaN. To achieve this, the growth conditions under which the facet plane is difficult to be formed can be employed, conversely from the aforementioned.

EXAMPLES

Example 1

A photoresist patterning (width: 2 µm, period: 4 µm, stripe direction: stripe extending direction is the <1-100> direction of the sapphire substrate) was made on a C-plane sapphire substrate and etched to a 2 µm depth in a square cross section with an RIE (Reactive Ion Etching) apparatus. The aspect ratio then was 1. After removing the photoresist, the substrate was set on a MOVPE apparatus. Then, the temperature was raised to 1100° C. under a hydrogen atmosphere and thermal etching was conducted. The temperature was lowered to 500° C., and trimethyl gallium (hereinafter TMG) as a III-group starting material and ammonia as an N starting material were flown to grow a GaN low temperature buffer layer. Then, the temperature was raised to 1000° C., and TMG and ammonia as starting materials and silane as a dopant were flown to grow an n-type GaN layer. The time for the growth was the time corresponding to 2 µm of conventional GaN growth without concavo-convex.

Observation of cross section after growth revealed growth in both convex part and concave part, as shown in FIG. 1(b).

Growth was performed according to a similar method for the time corresponding to 6 µm of conventional GaN growth free of concavo-convex. As a result, a flattened GaN film covering the concavo-convex part was obtained.

For the measurement of dislocation density, the above-mentioned sample was etched in a $H_2SO_4:H_3PO_4=1:1$ (250° C.) solution for 90 min and the number of formed pits was counted. In addition, the carrier density of the obtained film was determined by Hall measurement. Furthermore, a full width at half-maximum of X-ray rocking curve was also measured.

For comparison, a sample of growth on a sapphire substrate free of concavo-convex processing and a sample comprising 2 µm of GaN grown on a sapphire substrate free of concavo-convex processing, an $SiO_2$ mask formed in the same stripe direction and width as mentioned above and 4 µm of GaN grown on the substrate were prepared. The evaluation results of each sample are shown in Table 1.

TABLE 1

| sample | dislocation density $(cm^{-2})$ | carrier density $(cm^{-3})$ | FWHN of XRC (sec) |
|---|---|---|---|
| Example 1 | $1 \times 10^7$ | $1 \times 10^{16}$ | 170 |
| conventional ELO | $4 \times 10^7$ | $5 \times 10^{17}$ | 200–400 |
| Normal GaN | $2 \times 10^9$ | $1 \times 10^{16}$ | 220 |

It is evident that the dislocation density was reduced more in the sample of Example than in conventional ELO.

This is considered to be attributable to the occurrence of bending of the penetrating dislocation also in the concave part.

In contrast, the carrier density was of the same level as general GaN growth. The FWHM of XRC was 107 sec, which was the smallest, and the film had high quality by general evaluation.

Example 2

The procedure followed Example 1 except the shape of the concavo-convex part was changed to the following: (width: 2 µm, period: 6 µm, stripe direction: <1-100> of sapphire substrate), and etched to the depth of 0.5 µm by RIE apparatus in a square cross section.

Observation of cross section after growth revealed a flattened film in which the concavo-convex part had been buried as in Example 1, which is shown in FIG. 2(c). For observation of dislocation density, pits were formed and the number thereof was counted in the same manner as in Example 1.

Pits corresponding to the dislocation were scarcely found on the upper part of the convex part. This is considered to be the results of the growth that proceeded on the convex part in the state where the facet plane had been formed, and the dislocation was bent in the lateral direction.

Of the concave parts, those near the convex part did not show very many pits, but a number of pits were found in the area (width 4 μm) near the center. This is considered to be the results of dislocation propagated to the surface due to the absence of facet plane near the center of concave part. However, when the entire wafer is seen, it is clear that dislocation density reduced as compared to the growth on the substrate free of concavo-convex processing.

Example 3

The procedure followed Example 1 to grow GaN except an $SiO_2$ mask was formed on the concave part. Observation of cross section of the film after growth corresponding to 2 μm revealed GaN grown with a facet plane formed on the upper part of the convex part, as shown in FIG. 3(b). However, no film was formed in the concave part.

Further growth resulted in the joining of the facets on the upper parts of the adjacent convex parts. Thereafter, the growth proceeded to bury the joined valley part and a GaN film was obtained in time having cavity on the upper part of the concave part.

Pits were formed by etching. As a result, some pits corresponding to the dislocation were confirmed to be present in the center of the concave part. Except those, pits were scarcely observed.

Example 4

An n-type AlGaN cladding layer, an InGaN light emitting layer, a p-type AlGaN cladding layer and a p-type GaN contact layer were successively formed on the film obtained in Example 1 to give an ultraviolet LED wafer having a light emitting wavelength of 370 nm.

Then, electrodes were formed and the element was separated to give an LED element. The average output and inverse current characteristic (leak current upon application of −10V) of LED chips recovered from the whole wafer were evaluated. For comparison, used were ultraviolet LED chips wherein the above-mentioned structure was prepared by conventional ELO technique and ultraviolet LED chips wherein the above-mentioned structure was prepared using a conventional sapphire substrate. The evaluation results of these are shown in Table 2.

TABLE 2

| sample | output (mW) (electric current 20 mA) | leak current upon application of −10V |
| --- | --- | --- |
| Example 4 | 1.7 | 10 (nA) |
| Conventional ELO | 1.5 | 50 (nA) |
| normal GaN | 0.9 | 1 (μA) |

As shown in Table 2, the sample prepared according to the present invention showed higher output as compared to the conventional example, and it was found that a high quality LED with less leak current could be prepared.

Example 5

The procedure followed Example 1 except that trimethyl aluminum (TMA) was added when growing a semiconductor layer.

As a result, a flat film of AlGaN (Al composition 0.2) was grown to cover the concavo-convex part. Pits were formed by etching. As a result, there were not many pits corresponding to the dislocation in the upper part of the concave part. It was confirmed therefrom that an AlGaN film could be made to have high quality (low dislocation density) according to the present invention, which has not been achieved by the conventional ELO technique.

Example 6

The following shows an embodiment using GaN as a substrate. A photoresist patterning (width: 2 μm, period: 4 μp, stripe direction: <11-20> of GaN substrate) was made on a GaN substrate and etched to a 2 μm depth in a square cross section with an RIE apparatus. After removing the photoresist, the substrate was set on a MOVPE apparatus. Then, the temperature was raised to 1000° C. under a nitrogen, hydrogen, ammonia mixture atmosphere. Thereafter, TMG—ammonia as a starting material and silane as a dopant were flown to grow an n-type GaN layer. The growth time then corresponded to 4 μM of conventional GaN growth free of concavo-convex.

Observation of cross section after growth revealed a flattened GaN film covering the concavo-convex part of the substrate. Then, the pits in the obtained film were evaluated. The pit density of GaN used as the substrate was $2\times10^6$ $cm^{-2}$, but growth in this Example resulted in the decrease in the number of pits, as evidenced by $1\times10^6$ $cm^{-2}$ at the upper part of the concave part, and $5\times10^4$ $cm^{-2}$ at the upper part of the convex part. As such, it was confirmed that a further dislocation density reduction effect was achieved in a substrate with less dislocation.

Example 7

Using the GaN crystal prepared in Example 1 as a first crystal, a second crystal was grown thereon. A photoresist patterning (width: 2 μm, period: 4 μm, stripe direction: <11-20> of GaN substrate) was made on the first GaN crystal and etched to a 2 μm depth in a square cross section with an RIE apparatus. The patterning was conducted such that the concave part of the first crystal was disposed on the convex part of the substrate. After removing the photoresist, the substrate was set on a MOVPE apparatus. Then, the temperature was raised to 1000° C. under a nitrogen, hydrogen, ammonia mixture atmosphere. Thereafter, TMG—ammonia as a starting material and silane as a dopant were flown to grow an n-type GaN layer. The growth time then corresponded to 4 μm of conventional GaN growth free of concavo-convex.

Observation of cross section after growth revealed a flattened GaN film covering the concavo-convex part of the substrate. Then, the pits in the obtained film were evaluated. As a result, the number of pits decreased to $8\times10^5$ $cm^{-2}$. As such, it was confirmed that a further dislocation density reduction effect could be achieved by repeating this Example.

INDUSTRIAL APPLICABILITY

According to the above-described semiconductor base of the present invention and the production method thereof, a base surface capable of forming a facet plane can be formed from the start of the crystal growth, without using a mask layer, by applying a concavo-convex processing to the substrate. Therefore, problems of occurrence of new defects in the junction part of the part formed by lateral growth, due to the micro tilting of the axis, autodoping and unavailable selective growth of Al-containing semiconductor materials, which are due to the formation of a mask layer, can be resolved. Furthermore, because the growth of from the growth of a buffer layer to the growth of a semiconductor crystal layer such as light emitting part and the like can be continuously conducted in a single growth after forming a concavo-convex surface on a substrate, the production process can be advantageously simplified. Particularly, due to the absence of the need to form cavity parts, an additional effect that the problem of heat dissipation can be avoided and the like can be afforded, thereby making the invention highly valuable for improvement of properties and reduction of cost.

This application is based on patent application Nos. 282047/2000 and 68067/2001 filed in Japan, the contents of which are hereby incorporated by reference.

What is claimed is:

1. A semiconductor base comprising a substrate and a semiconductor crystal grown by vapor phase growth on the substrate,
    wherein said substrate is a crystal substrate comprising sapphire, SiC, Si, Spinel, ZnO, GaAs or NGO and has a crystal growth plane having a concavo-convex surface,
    wherein said semiconductor crystal is an $Al_xGa_{1-x-y}In_yN$ ($0 \leq x \leq 1$, $0 \leq y \leq 1$, $0 \leq x+y \leq 1$) crystal which grew from each of the concave part and the convex part and joined to cover said concavo-convex surface,
    wherein, during the growth step of said semiconductor crystal, facet structure growth occurs from both the concave part and the convex part, and
    wherein said semiconductor crystal has, in the inside, a dislocation line extending in the C axis direction from the substrate and then bending in the lateral direction as a result of the facet structure growth.

2. The semiconductor base of claim 1, wherein said semiconductor crystal is an AlGaN crystal.

3. The semiconductor base of claim 1, wherein the crystal growth plane of said substrate comprises convex parts forming a parallel stripe pattern.

4. The semiconductor base of claim 3, wherein the longitudinal direction of the stripe is parallel to the (1-100) plane or the (11-20) plane of the $Al_xGa_{1-x-y}In_yN$ crystal.

5. The semiconductor base of claim 4, wherein the longitudinal direction of the stripe concavo-convex processed on said substrate is parallel to the (1-100) plane or the (11-20) plane of the $Al_xGa_{1-x-y}In_y$ crystal and the precision thereof is within 1°.

6. The semiconductor base of claim 5, wherein the convex part concavo-convex processed on said substrate has a width A, the concave part adjacent thereto has a width B, the total thereof (A+B) is not more than 20 μm, and a depth h of said concave part is not less than 20% of the greater width of A or B.

7. The semiconductor base of claim 1, wherein an angle formed by a rising slope of the convex part concavo-convex processed on said substrate, and a substrate plane is not smaller than 60°.

8. The semiconductor base of claim 1, wherein the convex part concavo-convex processed on said substrate has a curved bottom surface.

9. The semiconductor base of claim 1, wherein the semiconductor crystal is grown on the substrate via a low temperature buffer layer.

* * * * *

UNITED STATES PATENT AND TRADEMARK OFFICE
CERTIFICATE OF CORRECTION

PATENT NO. : 7,179,667 B2  Page 1 of 1
APPLICATION NO. : 10/380933
DATED : February 20, 2007
INVENTOR(S) : Okagawa et al.

It is certified that error appears in the above-identified patent and that said Letters Patent is hereby corrected as shown below:

Column 4, lines 26-27, which read "$Al_xGa_{1-x-y}In_yN$ ($0\leqq x\leqq 1$, $0\leqq y\leqq 1$, $0\leqq x+y\leqq 1$)" should read --$Al_xGa_{1-x-y}In_yN$ ($0\leq x\leq 1$, $0\leq y\leq 1$, $0\leq x+y\leq 1$)--

Column 6, line 37, which reads "when $A+B\leqq 20$ μm" should read --when $A+B\leq 20$ μm--

Claim 1, column 11, lines 35-36, which read "$Al_xGa_{1-x-y}In_yN$ ($0\leqq x\leqq 1$, $0\leqq y\leqq 1$, $0\leqq x+y\leqq 1$)" should read --$Al_xGa_{1-x-y}In_yN$ ($0\leq x\leq 1$, $0\leq y\leq 1$, $0\leq x+y\leq 1$)--

Claim 4, column 12, line 15, which reads "$Al_xGa_{1-x-y}In_yN$ crystal" should read --$Al_xGa_{1-x-y}In_yN$ crystal--

Claim 5, column 12, line 19, which reads "$Al_xGa_{1-x-y}In_y$crystal" should read --$Al_xGa_{1-x-y}In_yN$ crystal--

Signed and Sealed this

Twenty-sixth Day of June, 2007

JON W. DUDAS
*Director of the United States Patent and Trademark Office*